United States Patent
Gribok et al.

(10) Patent No.: US 7,546,505 B2
(45) Date of Patent: Jun. 9, 2009

(54) BUILT IN SELF TEST TRANSPORT CONTROLLER ARCHITECTURE

(75) Inventors: Sergey Gribok, Santa Clara, CA (US); Alexander Andreev, San Jose, CA (US); Ivan Pavisic, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/557,513

(22) Filed: Nov. 8, 2006

(65) Prior Publication Data

US 2008/0109688 A1    May 8, 2008

(51) Int. Cl.
*G01R 31/28* (2006.01)
*G11C 29/00* (2006.01)
(52) U.S. Cl. .................. 714/733; 714/718; 714/734
(58) Field of Classification Search .................. 714/718, 714/724, 733, 734, 25, 30; 365/200, 201; 716/4
See application file for complete search history.

(56) References Cited

U.S. PATENT DOCUMENTS

| 5,325,367 | A | * | 6/1994 | Dekker et al. ................ 714/718 |
| 6,011,748 | A | * | 1/2000 | Lepejian et al. ............. 365/233 |
| 6,885,599 | B2 | * | 4/2005 | Saitoh et al. ................. 365/201 |

* cited by examiner

*Primary Examiner*—Phung M Chung
(74) *Attorney, Agent, or Firm*—Luedeka, Neely & Graham, P.C.

(57) ABSTRACT

A built in self test circuit in a memory matrix. Memory cells within the matrix are disposed into columns. The circuit has only one memory test controller, adapted to initiate commands and receive results. Transport controllers are paired with the columns of memory cells. The controllers receive commands from the memory test controller, test memory cells within the column, receive test results, and provide the results to the memory test controller. The transport controllers operate in three modes. A production testing mode tests the memory cells in different columns, accumulating the results for a given column with the controller associated with the column. A production testing mode retrieves the results from the controllers. A diagnostic testing mode tests memory cells within one column, while retrieving results for the column.

4 Claims, 6 Drawing Sheets

BUILT IN SELF TEST TRANSPORT CONTROLLER ARCHITECTURE

FIELD

This invention relates to the field of integrated circuit fabrication. More particularly, this invention relates to the built in self test of memory matrices.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as reconfigurable random access memory, or RRAM. RRAM contains sets of memories that are placed compactly within a memory matrix.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Testing of embedded memories is one of the most difficult stages of digital system testing. The known design methodologies require the insertion of a separate test controller (such as the memory test controller made by LogicVision, Inc. of San Jose, Calif.) for every embedded memory. This approach is unacceptable for memory matrix testing. Memory matrices contain up to several hundreds memories. It is highly undesirable to increase the matrix size by including hundreds of memory test controllers into the matrix.

There are two main types of digital system testing: production testing and diagnostic testing. Production testing is used to make sure that there are no defects in the integrated circuit. The test result for every memory is just one bit: passed/failed. Every chip must pass all production tests before it is delivered to the customer. Therefore, it is desirable to minimize the overall time that is required by the production testing. When all the memories inside the memory matrix are tested in a standard mode, then the total matrix test time tends to be unacceptably long.

Diagnostic testing can be used to detect the exact position of a defect in a memory. If a production test fails on a memory, then it is desirable to run a diagnostic test on the failed memory to determine exactly which ports or addresses of the memory are defective. Decoding the results of the diagnostic test typically requires analyzing the values output by the memory during the test.

What is needed, therefore, is a built in self test system for matrix memories that overcomes problems such as those described above, at least in part.

SUMMARY

The above and other needs are met by a built in self test circuit disposed within a memory matrix. Individual memory cells within the memory matrix are disposed into logical columns. The built in self test circuit has only one memory test controller, which is adapted to initiate test commands and receive test results. Transport controllers are uniquely paired with each one of the logical columns of memory cells. Each of the transport controllers is adapted to receive test commands from the memory test controller, test memory cells within the logical column as instructed by the test commands, receive test results from the logical column of memory cells, and provide the test results to the memory test controller.

The transport controllers are also adapted to selectively operate in three different modes under control of the memory test controller. A first production testing mode simultaneously tests the memory cells in different logical columns, while accumulating the test results for a given logical column with the transport controller associated with the given logical column. A second production testing mode retrieves the accumulated test results from the transport controllers. A diagnostic testing mode tests memory cells within one selected logical column, while simultaneously retrieving the test results for the one selected logical column.

In this manner, the built in self test circuit is able to perform all of the testing typically required by a memory matrix in a very efficient manner. One aspect of this is the simultaneous production testing of many memory cells in the different logical columns. This greatly reduces the time required for production testing the memory matrix. Further, there is only a single test controller for the matrix, instead of a test controller for each logical column of memory cells. By using one test controller with several transport controllers, space on the chip on which the integrated circuit memory matrix is formed is conserved.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
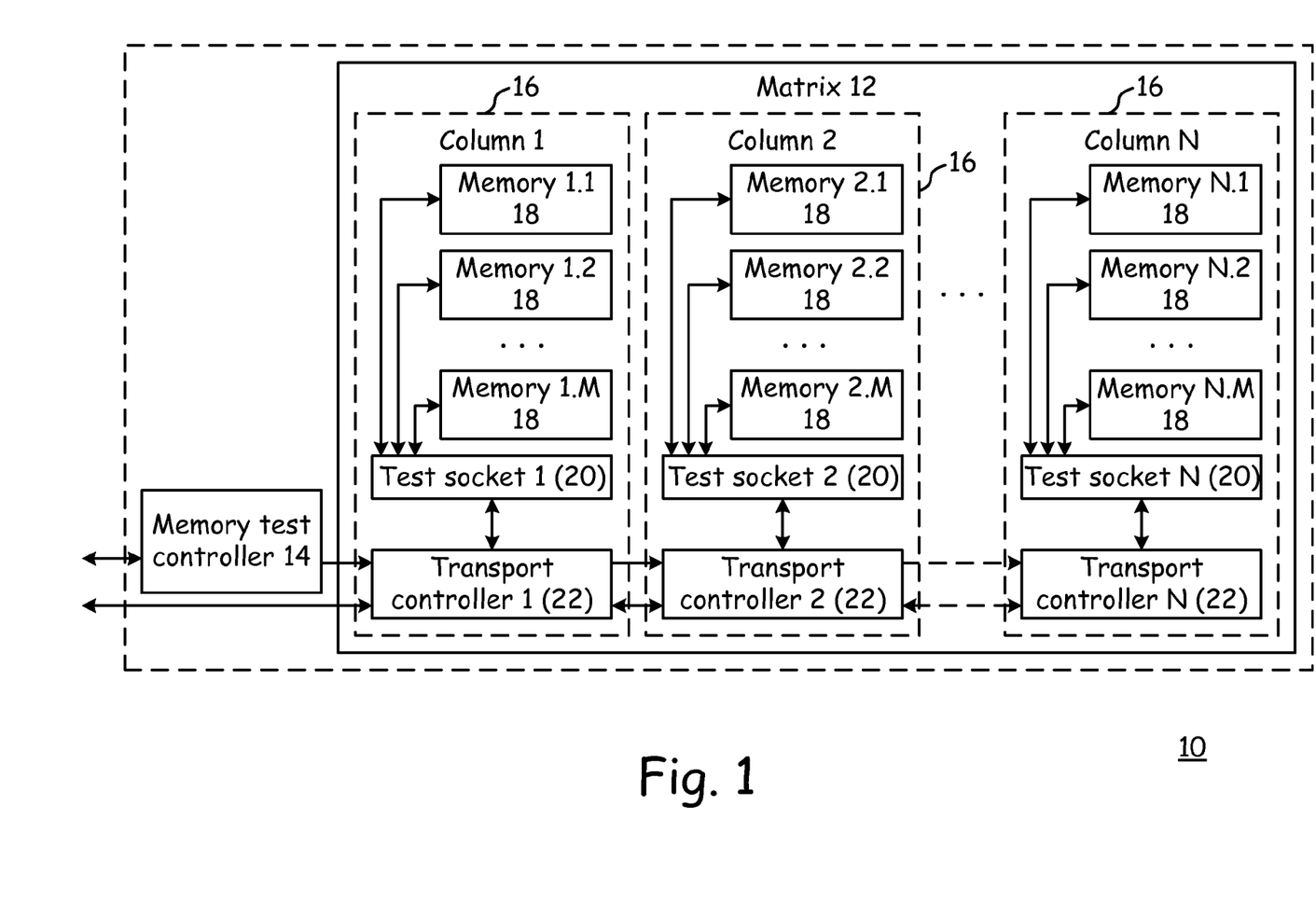
FIG. 1 is a functional block diagram of a portion of a memory matrix, including the memory test system, according to one embodiment of the invention.

This various embodiments of the present invention provide an architecture for a transport controller 22 disposed within a memory subsystem 10. The transport controller 22 is a part of memory matrix 12 built-in self test system. By "built-in," it is understood that the test system resides within the integrated circuit 100 (represented in FIG. 4), on the monolithic semiconducting chip with the memory system 10 that it tests. It is not externally located, such as on a separate chip or in an external tester. The proposed architecture enables efficient delivery of test signals between a built-in (on chip) memory tester circuit 14 and the memories 18 that reside within the memory matrices 12. The memory matrix 12 one embodiment is a structurally organized set of identical memories 18. In some embodiments, memories 18 in the matrix 12 are arranged into several columns 16 as shown in FIG. 1.

Thus, support of both production and diagnostic test modes is a desirable component of reliable memory testing. Therefore, various embodiments of the matrix transport system support detailed testing of any selected memory 18, in addition to simultaneous testing of large groups of memories 18.

The embodiments of the present invention describe an architecture of an inner matrix transport controller 22 that is part of a memory matrix transport system. In one embodiment, every matrix column 16 contains one transport controller 22 as shown in FIG. 1.

Each transport controller 22 is connected to the memories 18 the column 16 with which it is associated through an associated test socket 20, as depicted. The test socket 20 preferably sends test signals to the memories 18 inside the column 16, enables the selected memory 18, receives data from the memory 18 outputs, compares this data with the expected data values and sends the comparison result back to the transport controller 22.

Figure 2A:
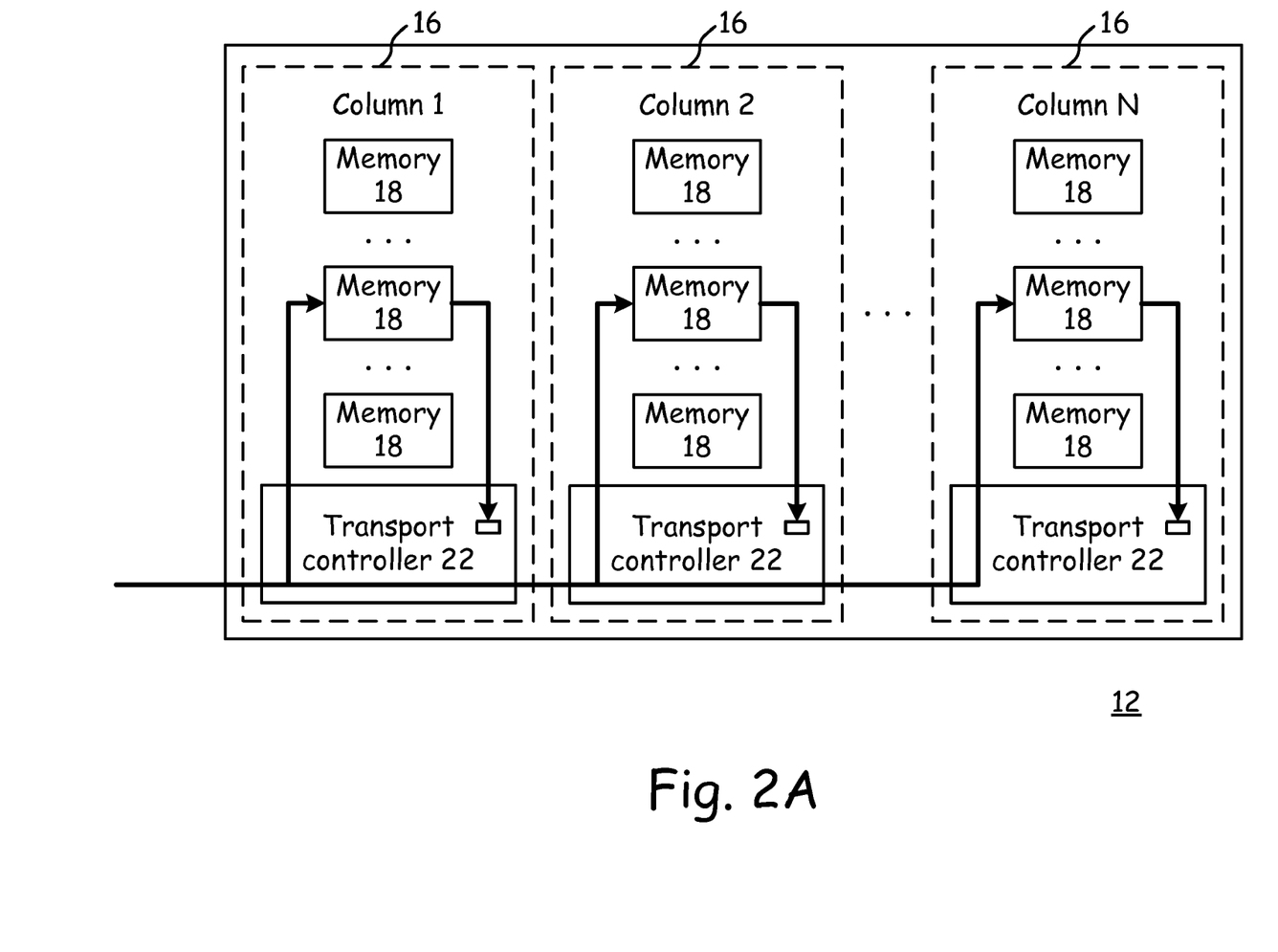
FIG. 2A is a functional block diagram of a portion of a memory matrix, depicting the parallel testing of memories in different memory columns of the matrix, according to one embodiment of the invention.
Figure 2B:
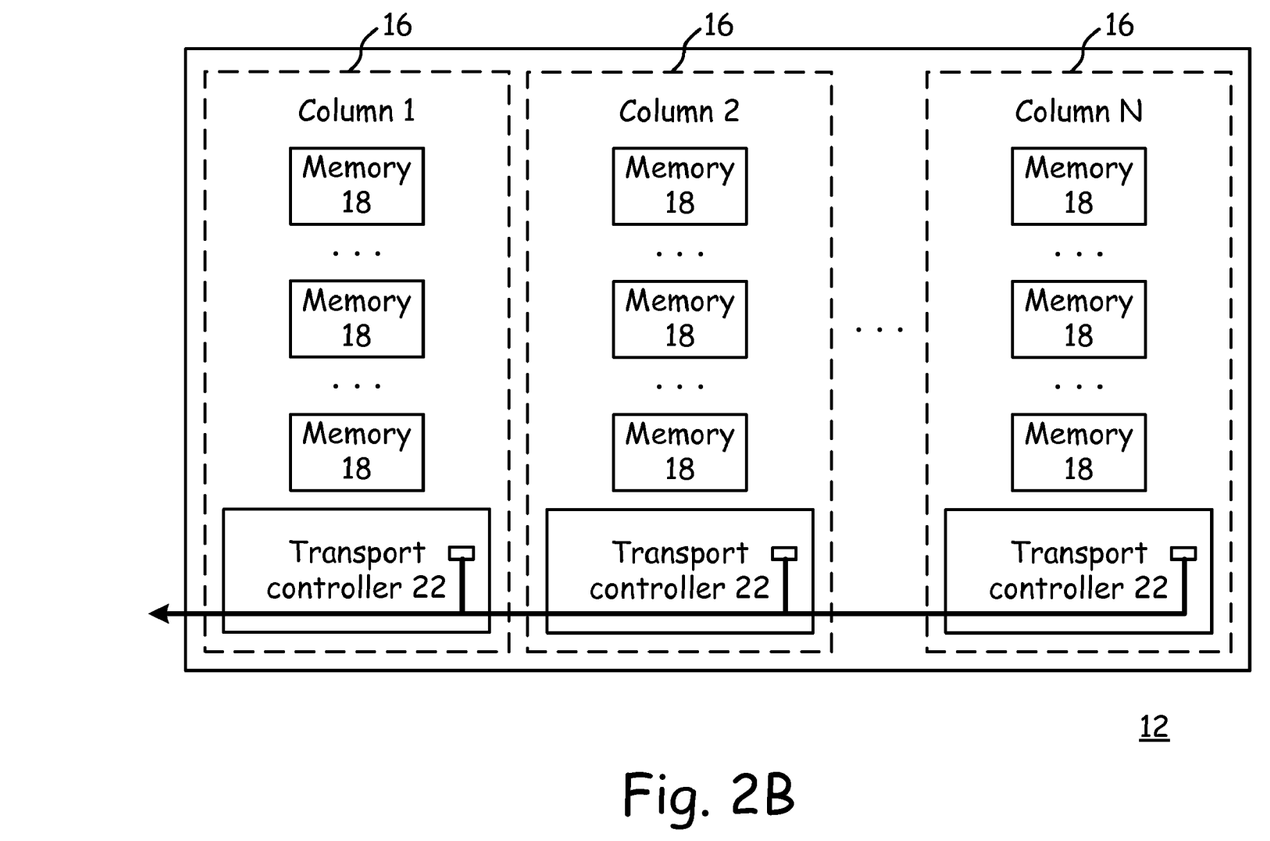
FIG. 2B is a functional block diagram of a portion of a memory matrix, depicting the parallel retrieving of accumulated test results from different memory columns of the matrix, according to one embodiment of the invention.
Figure 2C:
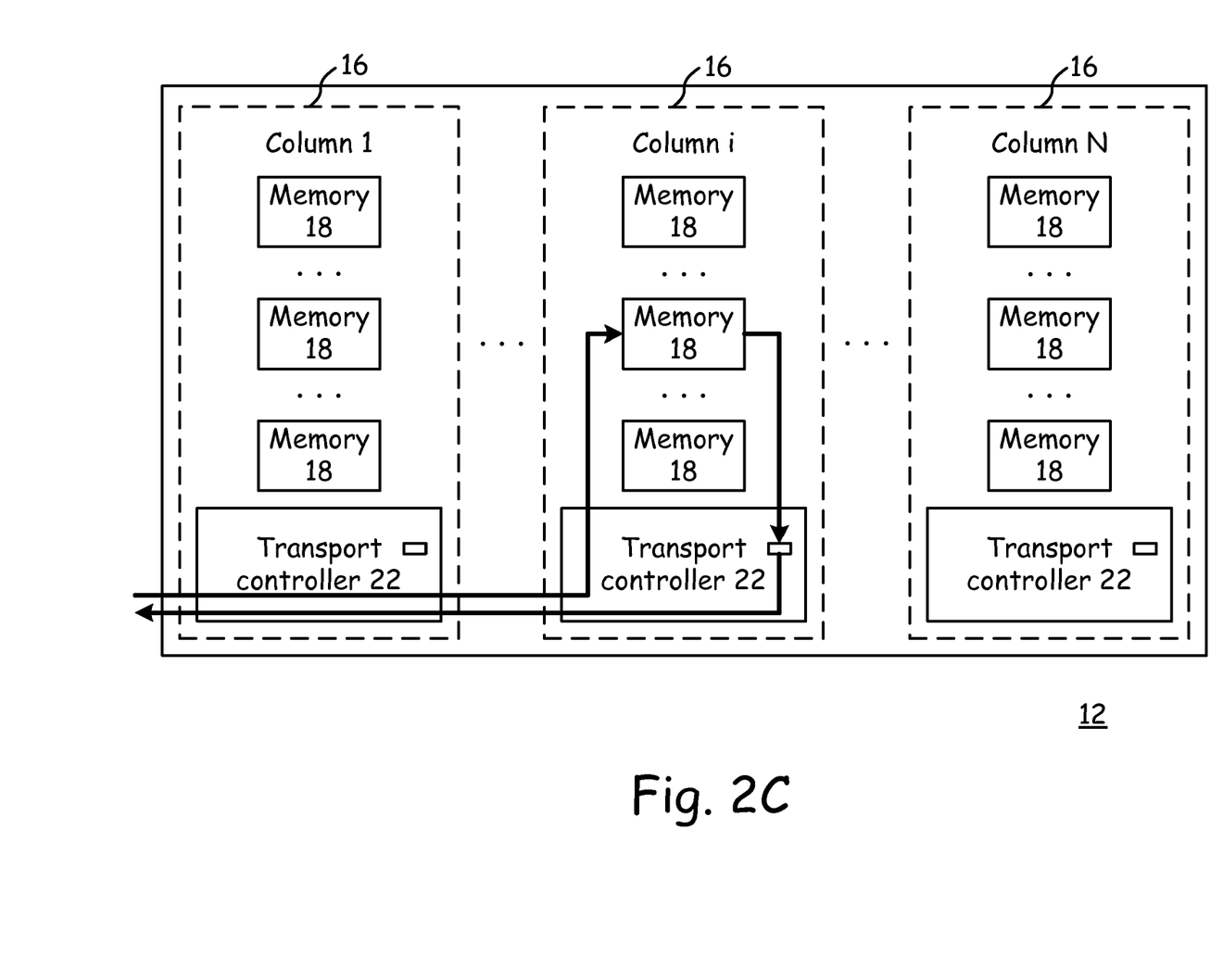
FIG. 2C is a functional block diagram of a portion of a memory matrix, depicting the testing of one selected memory instance while simultaneously retrieving the results from a memory column of the matrix, according to one embodiment of the invention.

The transport controller 22 for the K-th column 16 is connected to controllers 22 from the previous (K−1)-th column 16 and from the next (K+1)-th column 16. The controllers 22 are preferably enabled to work in three different modes: (1) simultaneous testing of several memories 18 from different columns 16, while accumulating the test results inside the controllers 22, as depicted in FIG. 2A; (2) retrieving the accumulated test results from the matrix 12, as depicted in FIG. 2B; and (3) testing one selected memory 18 instance while simultaneously retrieving the results, as depicted in FIG. 2C. Therefore the controller 22 supports both production testing, described as modes (1) and (2) above, and diagnostic testing, described as mode (3) above.

Transport Controller Ports

Figure 3:
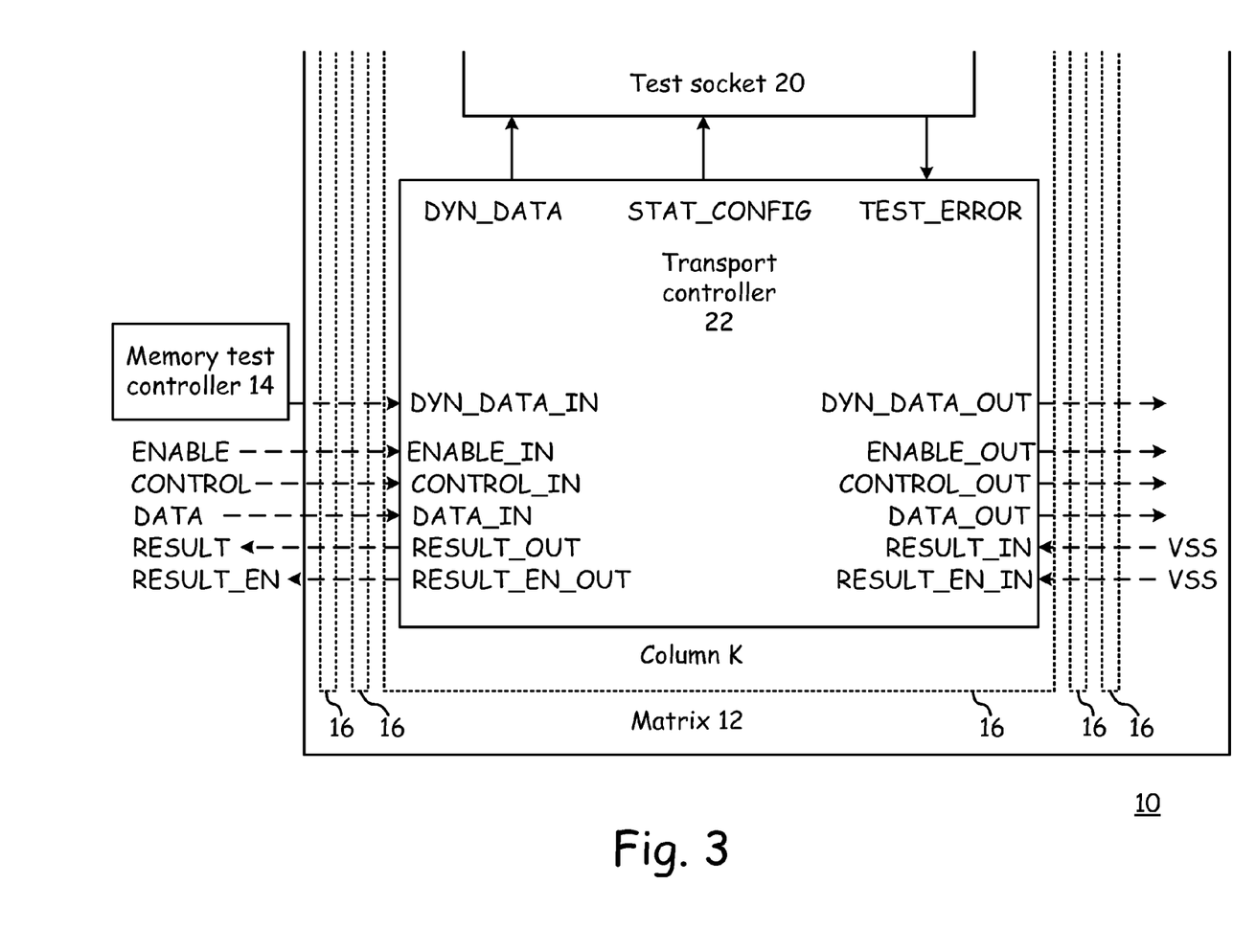
FIG. 3 is a input/output diagram for a transport controller according to one embodiment of the invention.

The transport controller 22 ports and interconnections between neighboring controllers 22 shown in FIG. 3. The transport controller 22 ports are described below.

DATA_IN is a 1-bit input that is connected to the DATA_OUT 1-bit output of the transport controller 22 for the previous column 16. The DATA_IN input of the transport controller 22 for the first column 16 is controlled from the outside of the matrix RAM system 12 through the DATA matrix input.

ENABLE_IN is a 1-bit input that is connected to the ENABLE_OUT 1-bit output of the transport controller 22 for the previous column 16. The ENABLE_IN input of the transport controller 22 for the first column 16 is controlled from the outside of the matrix RAM system 12 through the ENABLE matrix input.

CONTROL_IN is a 1-bit input that is connected to the CONTROL_OUT 1-bit output of the transport controller 22 the previous column 16. The CONTROL_IN input of the transport controller 22 for the first column 16 is controlled from the outside of matrix RAM system 12 through the CONTROL matrix input.

Therefore, the CONTROL, DATA, and ENABLE signals preferably propagate all the way down through the matrix 12, from left to right as depicted in the figures. Setting the configuration of all of the transport controllers 22 is preferably accomplished using just these three matrix ports.

DYN_DATA_IN is a multi-bit input that is connected to the DYN_DATA_OUT output of the transport controller 22 the previous column 16. The DYN_DATA_IN input of the transport controller 22 the first column 16 is directly connected to the memory test controller 14.

DYN_DATA is a multi-bit output that is connected to the test socket 20 for the same column 16 in which the transport controller 22 resides. Test signals from the memory test controller 14 are preferably moving through the DYN_DATA_IN and DYN_DATA_OUT ports of all of the transport controllers 22, and arriving at the test sockets 20 through the DYN_DATA outputs of the transport controllers 22.

STAT_CONFIG is a multi-bit output that is also connected to the test socket 20 in the same column 16. The STAT_CONFIG is preferably used for setting test configuration parameters, such as the memory index or the test type. These parameters are preferably immutable during the test.

TEST_ERROR is a 1-bit input that is also connected to the test socket 20 in the same column 16. The test socket 20 preferably sets this port to 1 if the memory output data values are not equal to the expected values, which indicates a failure.

RESULT_IN is a 1-bit input that is connected to the RESULT_OUT 1-bit output of the transport controller 22 for the next column 16. The RESULT_IN input of the transport controller 22 for the last column is connected to VSS. The RESULT_OUT output of the first column 16 goes to the matrix 12 RESULT output.

RESULT_EN_IN is a 1-bit input that is connected to the RESULT_EN_OUT 1-bit output of the transport controller 22 for the next column 16. The RESULT_EN_IN input of the transport controller 22 the last column 16 is connected to VSS. The RESULT_EN_OUT output of the first column 16 goes to the matrix 12 RESULT output.

Therefore, the RESULT and RESULT_EN signals preferably propagate all the way down through the matrix 12, from right to left as depicted in the figures. If RESULT_EN=1, then RESULT preferably represents the memory test result.

Preferably, there is also a clock input, which is not shown in the figures. Preferably, all of the transport controllers 22 in the matrix are working on the same clock.

Transport Controller Inner Structure

Figure 4:
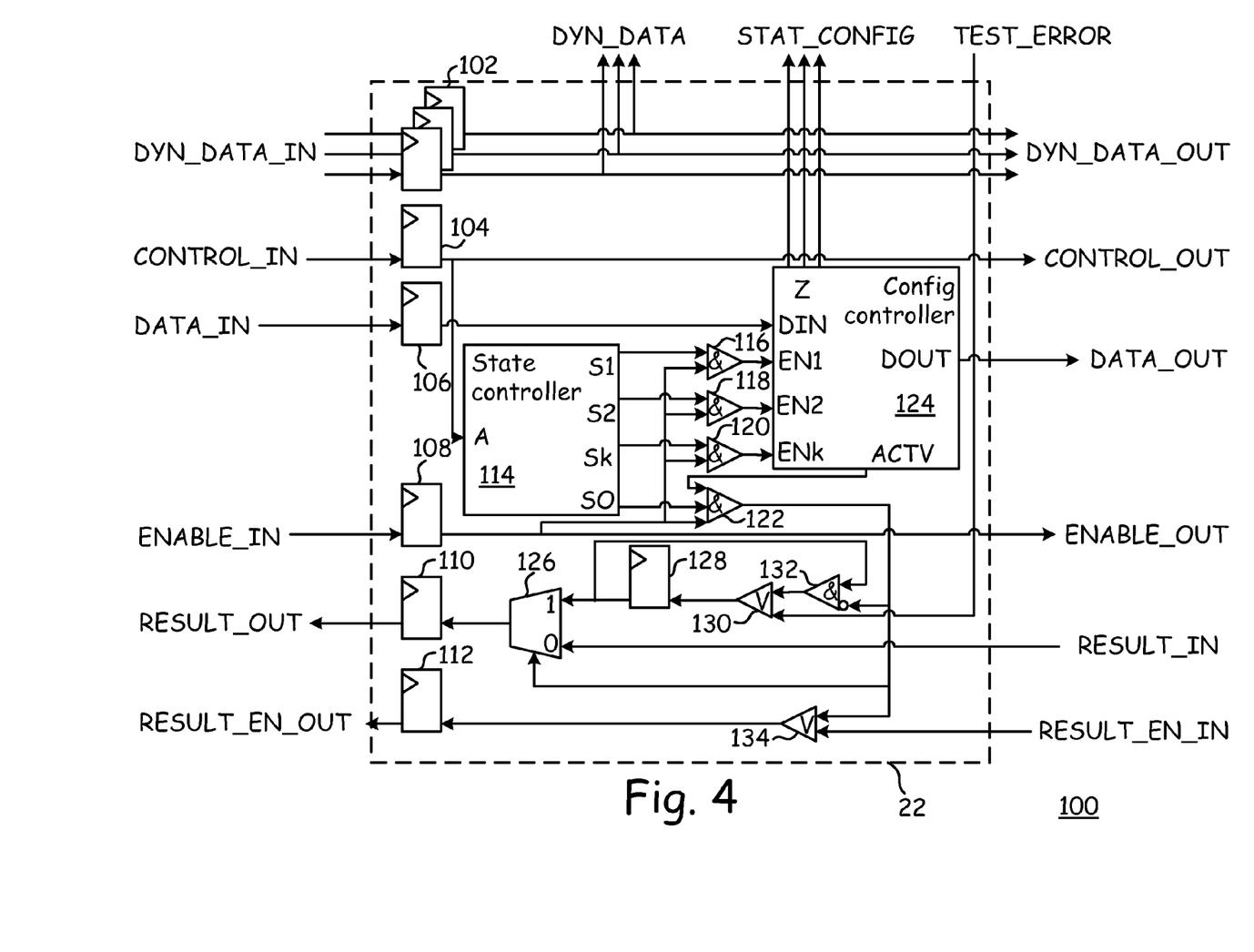
FIG. 4 is a schematic diagram for the transport controller according to one embodiment of the invention.

The inner structure of the preferred embodiment of the transport controller 22 is depicted in FIG. 4. It is appreciated that this is one specific example of the structure of the transport controller 22, and that various equivalent embodiments are also contemplated.

All of the DYN_DATA_IN inputs are preferably connected to data inputs of a set of flip-flop 102. The corresponding flip-flop 102 outputs are connected to the DYN_DATA and the DYN_DATA_OUT outputs.

The STAT_CONFIG signal preferably consists of several different components such as memory index, test type, and memory output bit index for comparison. Usually in a series of sequential memory tests, only one STAT_CONFIG component is changing. Therefore, to minimize the overall test time, it is desirable to load the different STAT_CONFIG components separately, as described below.

In this example, there are K different parts in the STAT_CONFIG signal. Therefore, the transport controller 22 has (K+1) different states, being: State 0, that scans the test results back from the 14; State 1, that loads the first part of STAT_CONFIG; State 2, that loads the second part of STAT_CONFIG; and State K, that loads the K-th part of STAT_CONFIG.

States 1, 2, . . . , K are preferably used before starting the memory test to set up all the needed configuration parameters. State 0 is preferably used during the test and after the test to retrieve the test results. The current state of the transport controller 22 is preferably set with the CONTROL_IN signal. The CONTROL_IN transport controller 22 input is preferably connected to the input of flip-flop 104. The output of this flip-flop 104 is preferably connected to the CONTROL_OUT port, and with the input A of the state controller 114.

The state controller 114 is preferably used to set the current state of the transport controller 22. It preferably has K+1 outputs, labeled S0 through Sk. Preferably, only one of these outputs at a time has a value of one, while the others are set at zero. A value of one on the i-th output indicates that the transport controller 22 is in the i-th state.

All the values from state controller 114 preferably go to the first inputs of K+1 AND logic elements 116 through 122. The second inputs of these AND elements 116-122 are preferably connected to the output of flip-flop 108. This output of flip-flop 108 is preferably also connected to the ENABLE_OUT output of the transport controller 22. The input of flip-flop 108 is preferably connected to the ENABLE_IN transport controller 22 input. The outputs of the AND elements 116 through 120 are preferably connected to the corresponding K inputs EN1 through ENk of the config controller 124.

The config controller 124 preferably used to set the STAT_CONFIG values. If the ENi config controller 124 input value is set to 1, then the i-th part of STAT_CONFIG is shifted from input DIN of the config controller 124. This input DIN is preferably connected to the output of flip-flop 106. The input of flip-flop 106 is connected to the transport controller 22 input DATA_IN.

The config controller 124 preferably has three different outputs, Z, DOUT, and ACTV. Output Z is preferably connected to the STAT_CONFIG output of the transport controller 22, output DOUT is preferably connected to the DATA_OUT output of the transport controller 22, and output ACTV is preferably connected to the third input of the 122 AND element. The ACTV signal preferably depends on the transport controller 22 configuration. ACTV is preferably set to one if the appropriate column 16 is active, or in other words, if at least some of the memory 18 in this column 16 is currently under test. If the ACTV is zero, then the corresponding column 16 is passive, or in other words, the memory 18 in the column 16 is not being tested.

The RESULT_OUT transport controller 22 output is preferably connected to the output of flip-flop 110. The input of this flip-flop 110 is preferably connected to the output of mux 126. The control input of this mux 126 preferably connected to the output of AND element 122. The first input of this mux 126 (the input that corresponds to the zero control value) is preferably connected to the RESULT_IN input of the transport controller 22, and the second input of the mux 126 is preferably connected to the output of flip-flop 128. The data input of flip-flop 128 is preferably connected to the output of OR element 130. The first input of 130 is preferably connected to the TEST_ERROR input of the transport controller 22, and the second input of 130 is preferably connected to the output of AND element 132. The first input of 132 is preferably connected to the output of flip-flop 128, and the second input of 132 is preferably connected with the inverted value from the output of 122.

The RESULT_EN_OUT output of the transport controller 22 is preferably connected to the output of the OR element 134. The first input of 134 is preferably connected to the RESULT_EN_IN input of the transport controller 22. The second input of 134 is preferably connected to the output of 122.

Operation or the Transport Controller

Before starting the memory test, it is preferred to set the STAT_CONFIG test configuration data. To set the i-th component of STAT_CONFIG, it is desirable to perform two steps. First, a special configuration sequence is sent via the CONTROL matrix input to set all of the transport controllers to the i-th state. Then the ENABLE matrix input is set to one and the target STAT_CONFIG values are shifted through the DATA matrix port.

For production testing, it is possible to set the STAT_CONFIG so that several columns 16 are active during the test. These columns 16 are then tested simultaneously. For diagnostic testing, preferably only one column 16 is active during the test.

After loading the configuration, and before the test execution, all of the transport controllers 22 are preferably set to state 0, such as through the CONTROL matrix input. Then the memory test controller 14 starts sending test vectors to the DYN_DATA matrix input. These vectors preferably move through all of the columns 16 to the test sockets 20. Every active test socket 20 (i.e. the test sockets 20 in the active columns 16) turns on and starts to send the test vectors to the memory 18 the respective column 16 that is specified by the STAT_CONFIG values. At the same time, the test socket 20 is analyzing the memory 18 outputs and producing the appropriate TEST_ERROR signal.

During execution of a production test, the ENABLE matrix input is preferably set to zero. Therefore, during the test execution, the TEST_ERROR signal from every active column 16 is accumulated in flip-flop 128. If the test is passed, or in other words if the TEST_ERROR is always zero during the test, then 128 contains zero after the test. If the test is failed, meaning that some errors occurred during the test, then the TEST_ERROR signal will have been set to one sometime during the test, and the flip-flop 128 will contain a value of one after the test.

After a production test, it is desirable to retrieve the accumulated test results from the flip-flops 128 in the active columns 16. To retrieve the results, the ENABLE matrix input is preferably set to one for just one clock cycle. Therefore, a value of one is applied to the RESULT_EN_OUT output in the active columns 16, and the value from the flip-flop 128 in each column 16 is applied to the RESULT_OUT output. At the same time, 128 is reset to a value of zero. Thus, a series of ones is observed on the RESULT_EN matrix output, and the corresponding series of test results are observed from the active columns 16 on the RESULT matrix output.

During the execution of a diagnostic test, the ENABLE signal has a value of one all the time. Therefore, the TEST_ERROR signal from the active column 16 goes directly to the RESULT_OUT output of the transport controller 22 for the respective column 16. At the same time, the RESULT_EN_OUT is set to a value of one. Thus, the RESULT_EN matrix output has a value of one during the test, and the RESULT matrix output signal is the same as the TEST_ERROR signal for the active column 16.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A built in self test circuit disposed within a memory matrix, where individual memory cells within the memory matrix are disposed into logical columns, the built in self test circuit comprising:
   only one memory test controller adapted to initiate test commands and receive test results, and
   transport controllers, where each of the transport controllers is uniquely paired with one of the logical columns of memory cells, each of the transport controllers adapted to receive test commands from the memory test controller, test memory cells within the logical column as instructed by the test commands, receive test results from the logical column of memory cells, and provide the test results to the memory test controller.

2. The built in self test circuit of claim 1, where the transport controllers are adapted to selectively operate in three different modes under control of the memory test controller, the three different modes being:
   a first production testing mode for simultaneous testing of memory cells in different logical columns, while accumulating the test results for a given logical column with the transport controller associated with the given logical column,
   a second production testing mode for retrieving the accumulated test results from the transport controllers, and
   a diagnostic testing mode for testing memory cells within one selected logical column, while simultaneously retrieving the test results for the one selected logical column.

3. A built in self test circuit disposed within a memory matrix, where individual memory cells within the memory matrix are disposed into logical columns, the built in self test circuit comprising:
   only one memory test controller adapted to initiate test commands and receive test results, and
   transport controllers, where each of the transport controllers is uniquely paired with one of the logical columns of memory cells, each of the transport controllers adapted to receive test commands from the memory test controller, test memory cells within the logical column as instructed by the test commands, receive test results from the logical column of memory cells, and provide the test results to the memory test controller,
   where the transport controllers are adapted to selectively operate in three different modes under control of the memory test controller, the three different modes being,
      a first production testing mode for simultaneous testing of memory cells in different logical columns, while accumulating the test results for a given logical column with the transport controller associated with the given logical column,
      a second production testing mode for retrieving the accumulated test results from the transport controllers, and
      a diagnostic testing mode for testing memory cells within one selected logical column, while simultaneously retrieving the test results for the one selected logical column.

4. An embedded memory system, comprising:
   a memory matrix, where individual memory cells within the memory matrix are disposed into logical columns,
   only one memory test controller adapted to initiate test commands and receive test results, and
   transport controllers, where each of the transport controllers is uniquely paired with one of the logical columns of memory cells, each of the transport controllers adapted to receive test commands from the memory test controller, test memory cells within the logical column as instructed by the test commands, receive test results from the logical column of memory cells, and provide the test results to the memory test controller,
   where the transport controllers are adapted to selectively operate in three different modes under control of the memory test controller, the three different modes being,
      a first production testing mode for simultaneous testing of memory cells in different logical columns, while accumulating the test results for a given logical column with the transport controller associated with the given logical column,
      a second production testing mode for retrieving the accumulated test results from the transport controllers, and
      a diagnostic testing mode for testing memory cells within one selected logical column, while simultaneously retrieving the test results for the one selected logical column.

* * * * *